United States Patent
Miura

(10) Patent No.: US 8,319,416 B2
(45) Date of Patent: Nov. 27, 2012

(54) DISPLAY DEVICE AND ELECTRONIC APPARATUS HAVING A DISPLAY DEVICE

(75) Inventor: Kiwamu Miura, Kanagawa (JP)

(73) Assignee: Sony Corporation, Tokyo (JP)

( * ) Notice: Subject to any disclaimer, the term of this patent is extended or adjusted under 35 U.S.C. 154(b) by 276 days.

(21) Appl. No.: 12/754,947

(22) Filed: Apr. 6, 2010

(65) Prior Publication Data

US 2010/0259165 A1    Oct. 14, 2010

(30) Foreign Application Priority Data

Apr. 13, 2009    (JP) ................... 2009-096609

(51) Int. Cl.
*H01L 51/00*    (2006.01)
(52) U.S. Cl. ........................ 313/498; 313/504
(58) Field of Classification Search .......... 313/500, 313/504, 505, 498
See application file for complete search history.

(56) References Cited

U.S. PATENT DOCUMENTS

| | | | | |
|---|---|---|---|---|
| 5,748,276 A | * | 5/1998 | Uno et al. | 349/144 |
| 6,504,592 B1 | * | 1/2003 | Takatori et al. | 349/129 |
| 2004/0113872 A1 | * | 6/2004 | Nanno et al. | 345/76 |
| 2005/0264178 A1 | * | 12/2005 | Lan et al. | 313/503 |
| 2006/0023137 A1 | * | 2/2006 | Kamada et al. | 349/44 |
| 2006/0038930 A1 | * | 2/2006 | Kaneko | 349/41 |
| 2006/0081844 A1 | * | 4/2006 | Hirosue et al. | 257/59 |
| 2006/0158095 A1 | * | 7/2006 | Imamura | 313/500 |
| 2007/0108443 A1 | * | 5/2007 | Kim | 257/40 |
| 2008/0218065 A1 | * | 9/2008 | Ishihara et al. | 313/504 |
| 2009/0015768 A1 | * | 1/2009 | Igeta et al. | 349/106 |

FOREIGN PATENT DOCUMENTS

CN    101051649 A    * 10/2007
JP    2007-286081    11/2007

* cited by examiner

*Primary Examiner* — Nimeshkumar Patel
*Assistant Examiner* — Steven Horikoshi
(74) *Attorney, Agent, or Firm* — SNR Denton US LLP

(57) ABSTRACT

A display device includes: plural sub-pixels included in a main pixel, emitting light of different colors respectively; at least three apertures arranged so as to be aligned along one direction in the sub-pixel; and an aperture defining portion defining aperture lengths so that an aperture length of an aperture other than apertures at both edge portions along the one direction is longer than an aperture length of apertures at both edge portions along the one direction in the at least three apertures.

4 Claims, 14 Drawing Sheets

Related Art

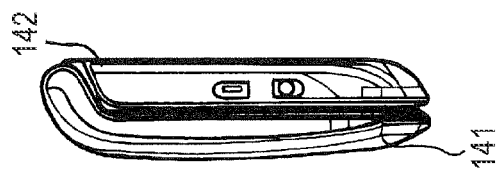
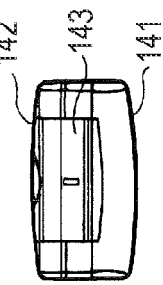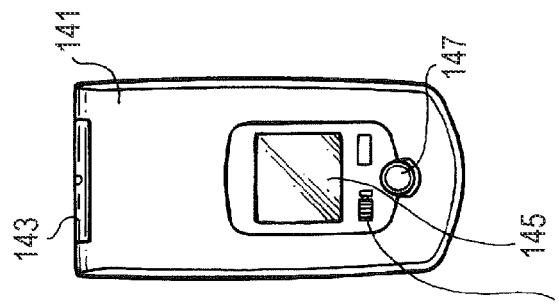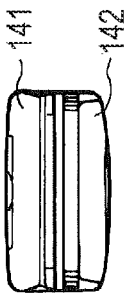
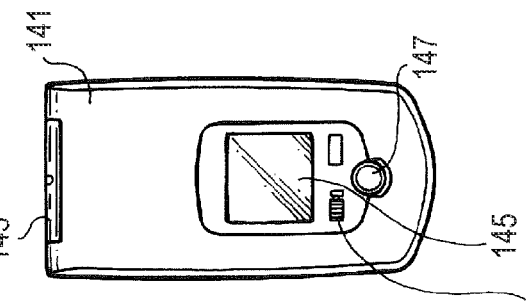
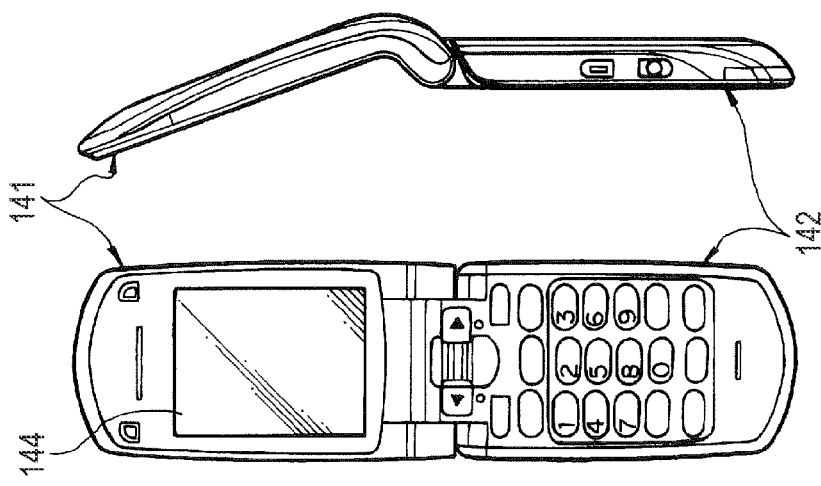

DISPLAY DEVICE AND ELECTRONIC APPARATUS HAVING A DISPLAY DEVICE

BACKGROUND OF THE INVENTION

1. Field of the Invention

The present invention relates to a display device and an electronic apparatus. More particularly, the invention relates to a display device and an electronic apparatus in which a main pixel is provided with plural sub-pixels displaying different colors, and the sub-pixel is divided into plural apertures.

2. Description of the Related Art

An organic EL (Electro-Luminescence) display device does not emit light when there are foreign objects or the like in an organic EL light emitting layer. This is a phenomenon in which a leakage path is formed between electrodes due to foreign objects mixed into electrodes of a pixel and the entire pixel does not emit light. The entire pixels do not emit light also when foreign objects exist on a thin-film transistor substrate (TFT substrate) and power supply to the organic EL layer is shut off.

When the organic EL layer is formed by using a mask on the TFT substrate, it is difficult to completely exclude foreign objects. Since a region in which a leakage path is actually generated is part of the pixel, when one pixel is divided into plural sub-pixels and remaining sub-pixels without leakage emit light normally, it is expected that pixel defects are reduced.

For example, a structure in which one pixel is divided into plural regions is disclosed in JP-A-2007-286081 (Patent Document 1). That is, one pixel is divided into plural TFTs or EL elements. Accordingly, even when a leakage path is generated at any of divided regions, or even when power supply to the EL element is shut off, light emission (lighting) at other divided regions can be maintained. In this case, the light emitting area of the EL element is reduced as compared with a normal pixel, however, a complete black dot defect can be avoided.

SUMMARY OF THE INVENTION

However, in a related-art display device in which the aperture area of one main pixel is simply divided equally, when there is a defect at an aperture arranged at an edge portion, the distance from an aperture at which light emission is maintained to a light emitting region of an adjacent pixel becomes long. Accordingly, a black (non-light emitting) region becomes wide as compared with a case in which there is a defect at an aperture at the center portion, therefore, there arises a problem that the region tends to be visible as a black dot.

In view of the above, in the case where a main pixel is divided into plural aperture, it is desirable to avoid generation of difference in visibility as a non-light emitting region when a defect occurs at any aperture.

According to a embodiment of the invention, there is provided a display device including plural sub-pixels included in a main pixel, emitting light of different colors respectively, at least three apertures arranged so as to be aligned along one direction in the sub-pixel, and an aperture defining portion defining aperture lengths so that an aperture length of an aperture other than apertures at both edge portions along the one direction is longer than an aperture length of apertures at both edge portions along the one direction in the at least three apertures. Also according to the embodiment of the invention, there is provided an electronic apparatus including the display device in a main casing thereof.

In the embodiment of the invention, even when a failure occurs at a pixel corresponding to any one of the at least three apertures, distances between adjacent normal pixels can be approximately equal.

Specifically, in the embodiment of the invention, when a distance between the aperture other than apertures at both edge portions and an adjacent aperture is "a", a distance between one of the apertures at both edge portions and one of apertures at both edge portions in a main pixel adjacent in one direction is "b", an aperture length of one of the apertures at both edge portions along the one direction is "Le" and an aperture length of an aperture other than the apertures at both edge portions along the one direction is "Ls", a<b is satisfied, and further, Le+a+b=Ls+2a is satisfied.

According to the above, even when a failure occurs at a pixel corresponding to any of at least three apertures, distances of normal pixels adjacent to the failure position can be approximately equal.

According to the embodiment of the invention, it is possible to provide a display device in which, in the case where the main pixel is divided into plural apertures, the difference in visibility as a non-light emitting region is not generated even when a failure occurs at any aperture to thereby realizing high yield.

BRIEF DESCRIPTION OF THE DRAWINGS

FIG. 16A to FIG. 16G are views showing a portable terminal device, for example, a cellular phone device to which the embodiment is applied.

DESCRIPTION OF THE PREFERRED EMBODIMENTS

Herein after, a best mode for carrying out the invention (referred to as an "embodiment" in the following description) will be explained. The explanation will be made in the following order.

1. Outline of a display device (Whole configuration, Cross-sectional structure)
2. Configuration of a pixel portion (Comparative example, Basic configuration of the embodiment, Circuit configuration)
3. Specific example (Comparative example, Present embodiment, Specific examples: No. 1, No. 2)
4. Application example

1. Outline of a Display Device

[Whole Configuration]

Figure 1:
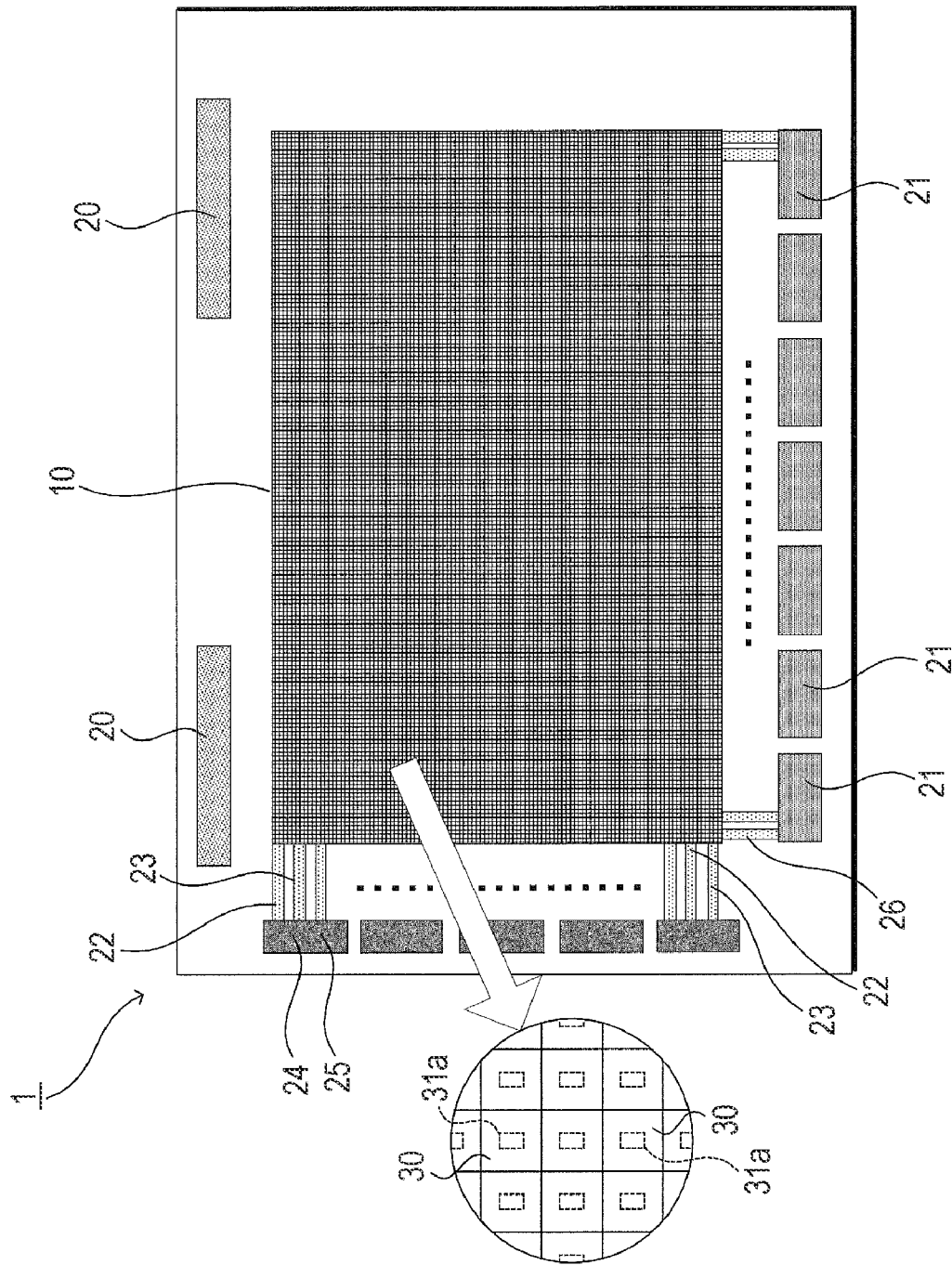
FIG. 1 is a schematic plan view explaining an outline of a display device according to an embodiment of the invention.

FIG. 1 is a schematic plan view explaining an outline of the whole configuration of a display device according to an embodiment of the invention. That is, a display device 1 includes a display region 10 provided at approximately the center of a support substrate such as a glass substrate, power supply portions 20 arranged at the periphery of the display region 10, signal line input portions 21, a scanning signal input portions 24 and power supply control signal input portions 25.

In the display region 10, plural pixel portions 30 are arranged vertically and horizontally in a matrix state. In the display device displaying color images, an assortment of pixel portions 30 corresponding to, for example, R (red), G (green) and B (blue) constitutes a display pixel.

Each pixel portion 30 includes a drive portion 31a having a drive transistor. The drive transistor of the drive portion 31a is made of a thin-film transistor (TFT) formed on a substrate, which drives a drive target provided in the pixel portion 30 by voltage application.

When the drive target in the pixel portion 30 is the organic EL (Electro Luminescence) layer, an electric field given to the organic EL layer corresponding to respective colors is controlled by the drive transistor. When the drive target in the pixel portion 30 is the liquid crystal layer, the electric field given to the liquid crystal is controlled by the drive transistor.

A power supply control line 22 and a scanning line 23 are connected to the drive transistor, and the drive transistors in the display region 10 are sequentially driven by the scanning signal input portions 24 to thereby display images.

That is, power supply voltage is supplied to a horizontal pixel row selected by the scanning line 23 from the power supply control line 22, and display of the pixel is performed in accordance with a pixel signal inputted from the signal line input portion 21 in the vertical pixel column direction through a signal line 26. The selection of the horizontal pixel row by the scanning lines 23 and the input of pixel signals from the signal lines 26 are synchronized to drive the display region 10, as a result, images are displayed.

In order to manufacture the drive substrate 1, respective layers such as a semiconductor layer and an insulating film layer are formed on the support substrate by a deposition process, for example, a CVD (Chemical Vapor Deposition) and the like, and drive elements are formed and wiring is patterned by an impurity implantation process, a photolithography process and so on.

[Cross-Sectional Structure]

Figure 2:
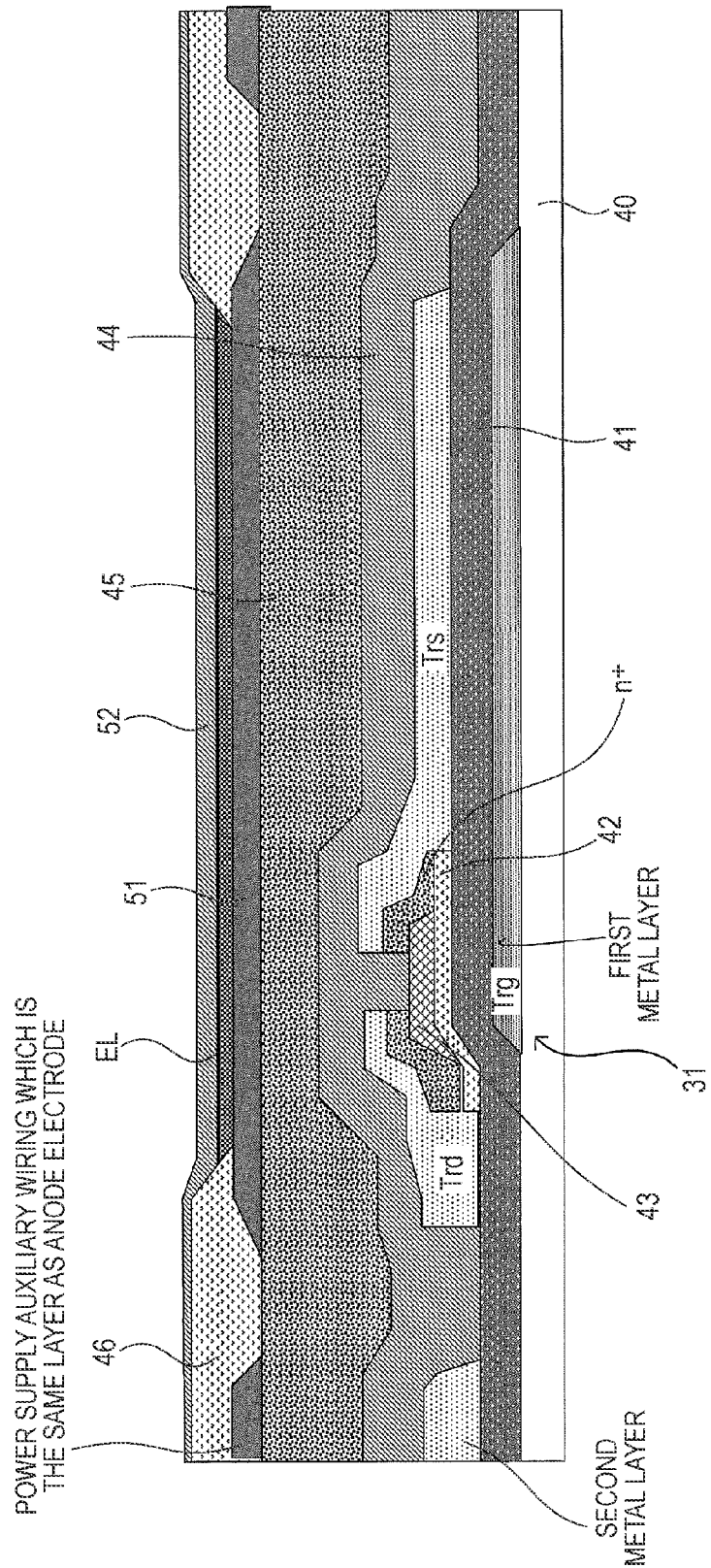
FIG. 2 is a schematic cross-sectional view of the display device according to the embodiment.

FIG. 2 is a schematic cross-sectional view explaining a configuration example of a drive transistor in a pixel portion.

That is, a gate electrode Trg which is a first metal layer is formed within a glass substrate 40 and a semiconductor layer 42 is formed thereon through a gate insulating film 41.

The semiconductor layer 42 is formed by amorphous silicon being annealed and crystallized by irradiating laser light. Over the semiconductor layer 42, an n+ layer is formed right and left of an etching stopper 43. A source electrode Trs and a drain electrode Trd which are second metal layers are formed through the n+ layer.

A passivation film 44 is formed on the drive transistor 31, and an anode electrode 51 is formed through an insulating planarization film 45 to be formed thereon.

Furthermore, an insulating film for defining apertures 46 which defines apertures is formed on the anode electrode 51, and an organic EL layer is formed within the aperture on the anode electrode 51. Additionally, a cathode electrode 52 is formed on the organic EL layer over the whole surface.

2. Configuration of a Pixel Portion

Next, a configuration of a pixel portion in the display device according to the embodiment will be explained. In order to make the configuration of the pixel portion of the display device in the embodiment easily understandable, explanation will be made with a comparative example.

Comparative Example

Figure 3:
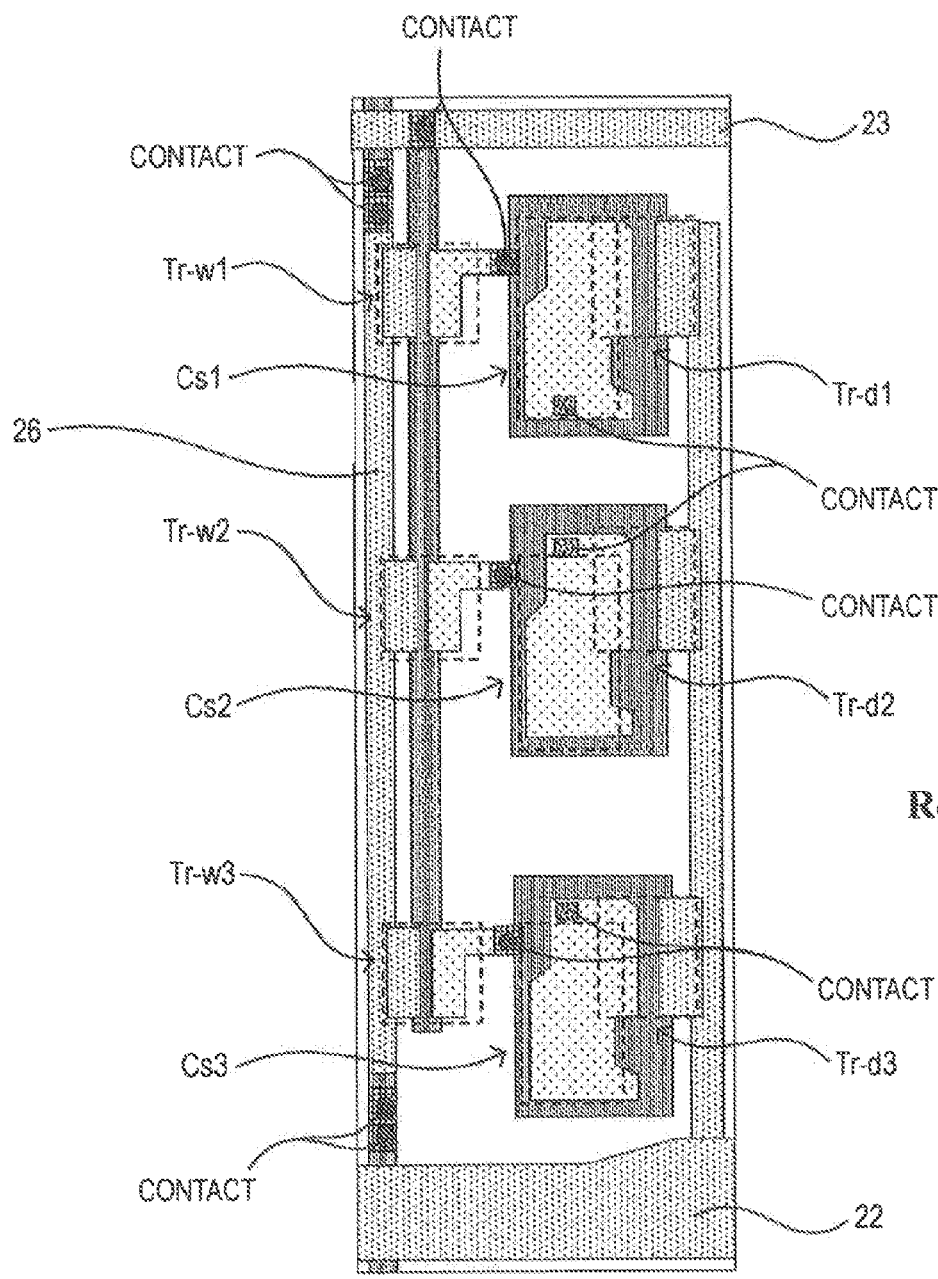
FIG. 3 is a plan view explaining a transistor structure of a pixel portion in a comparative example.

FIG. 3 is a plan view explaining the transistor structure of a pixel portion in a comparative example. In FIG. 3, a transistor structure in one main pixel corresponding to any one color of R (red), G (green) and B (blue) is shown. In the pixel portion, three drive transistors Tr-d1 to Tr-d3 are provided in one main pixel, and three write transistors Tr-w1 to Tr-w3 and three storage capacitors Cs1 to Cs3 are provided so as to correspond to these drive transistors.

In the main pixel, gate electrodes of the write transistors Tr-w1 to Tr-w3 are connected to the scanning line 23 in common. Also, drain electrodes of the write transistors Tr-w1 to Tr-w3 are connected to the signal line 26 in common. Additionally, drain electrodes of the drive transistors Tr-d1 to Tr-d3 are connected to the power supply control line 22 in common. Accordingly, three write transistors Tr-w1 to Tr-w3 and three drive transistors Tr-d1 to Tr-d3 operate at the same time in the main pixel.

Figure 4:
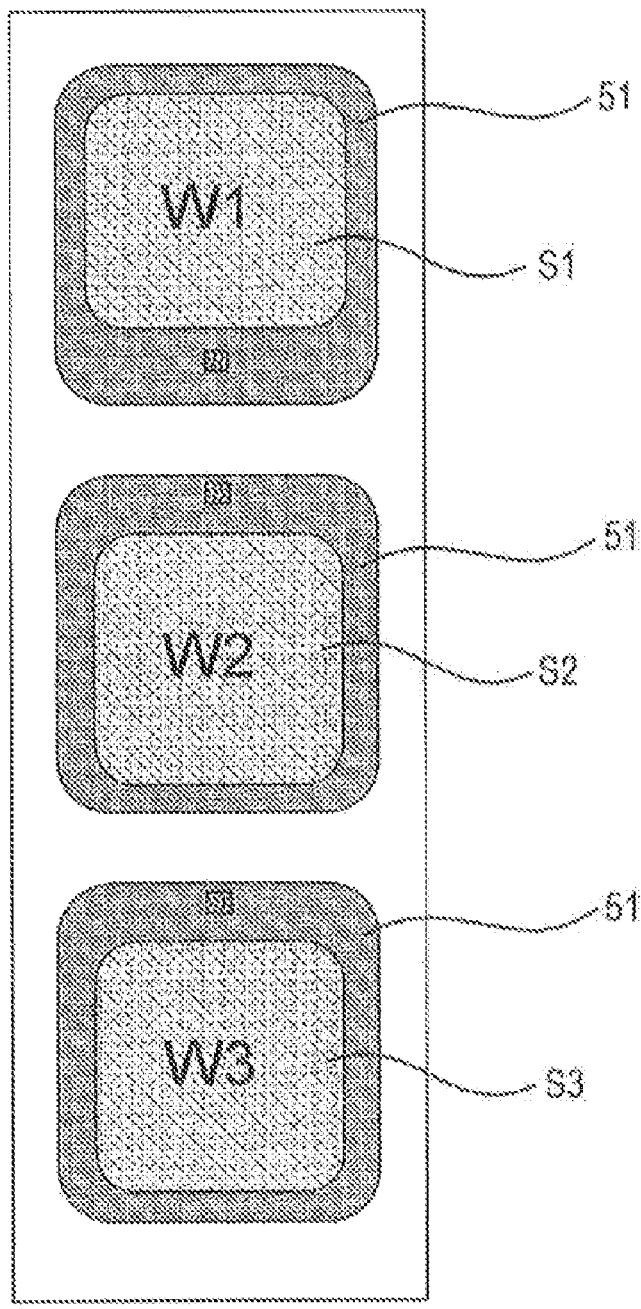
FIG. 4 a plan view explaining apertures of the pixel portion in the comparative example.

FIG. 4 is a plan view explaining apertures of the pixel portion in the comparative example. The plan view shows a layout of anode electrodes 51 and apertures corresponding to the transistor structure of one main pixel shown in FIG. 3. The anode electrodes 51 are connected to source electrodes of respective drive transistors Tr-d1 to Tr-d3 shown in FIG. 3 through contacts. Since there are three drive transistors Tr-d1 to Tr-d3 in the example shown in FIG. 3, three anode electrodes 51 are provided so as to correspond to these transistors.

A first aperture S1, a second aperture S2 and a third aperture S3 are provided at regions inside the three anode electrodes 51. The aperture size of the first aperture S1, the second aperture S2 and the third aperture S3 is determined by the insulating film for defining apertures 46. Though the insulating film for defining apertures 46 is used as a component for determining the aperture size, a shielding film to be provided at an upper layer can be used as an aperture defining portion. Emitted light is irradiated from the respective apertures S1 to S3.

In the comparative example, when the aperture size of the first aperture S1 is W1, the aperture size of the second aperture S2 is W2 and the aperture size of the third aperture S3 is W3, W1=W2=W3, that is, the respective apertures are provided with equal size.

Basic Configuration of the Embodiment

Figure 5:
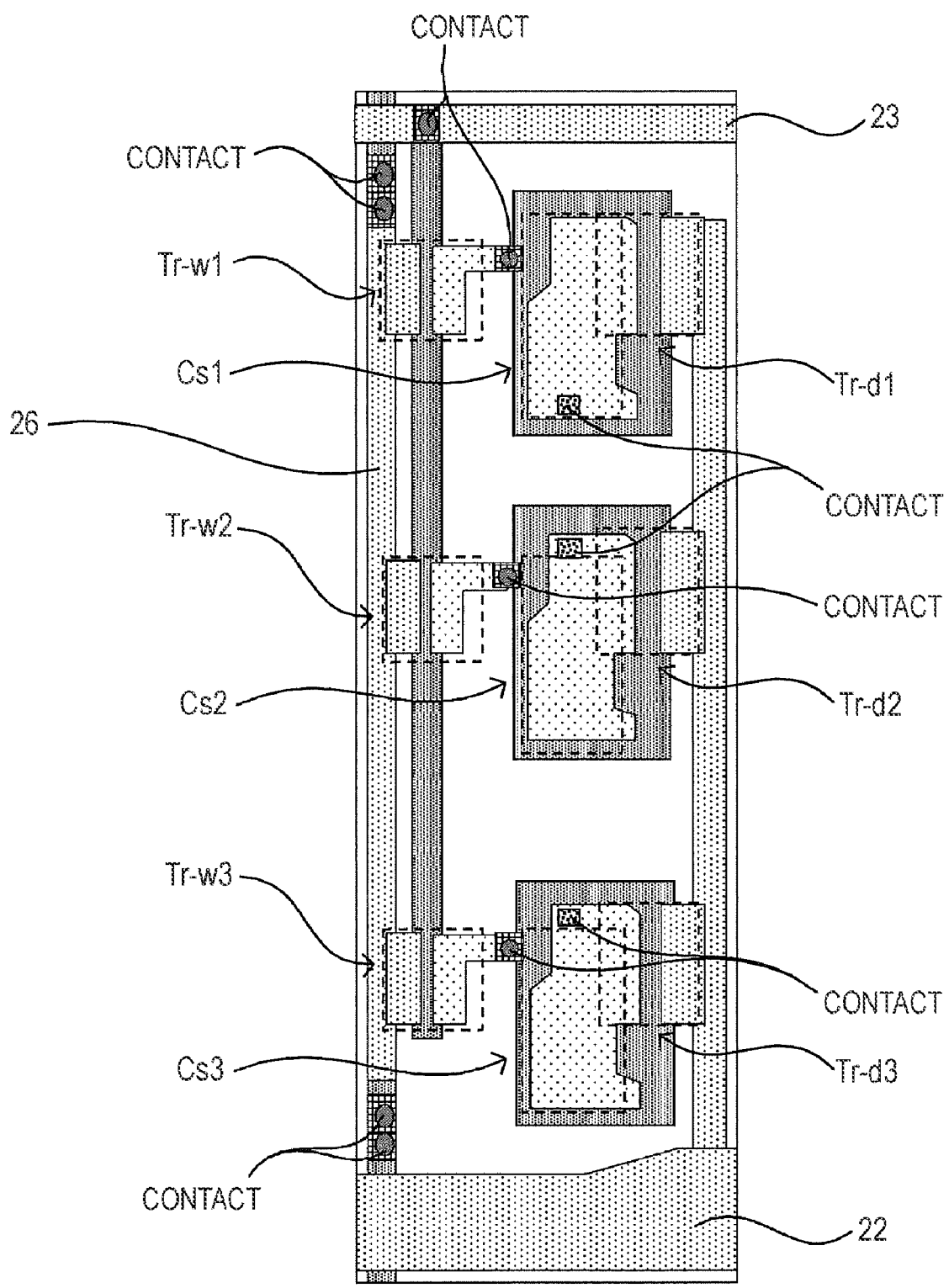
FIG. 5 is a plan view explaining a transistor structure of a pixel portion in the embodiment.

FIG. 5 is a plan view explaining a transistor structure of a pixel portion in the embodiment. In FIG. 5, the transistor structure of one main pixel corresponding to any one color of R (red), G (green) and B (blue) is shown. In the pixel portion, three drive transistors Tr-d1 to Tr-d3 are provided in one main pixel, and three write transistors Tr-w1 to Tr-w3 and three storage capacitors Cs1 to Cs3 are provided so as to correspond to these drive transistors.

In the main pixel, gate electrodes of the write transistors Tr-w1 to Tr-w3 are connected to the scanning line 23 in common. Also, drain electrodes of the write transistors Tr-w1 to Tr-w3 are connected to the signal line 26 in common. Additionally, drain electrodes of the drive transistors Tr-d1 to Tr-d3 are connected to the power supply control line 22 in common. Accordingly, three write transistors Tr-w1 to Tr-w3 and three drive transistors Tr-d1 to Tr-d3 operate at the same time in the main pixel.

Figure 6:
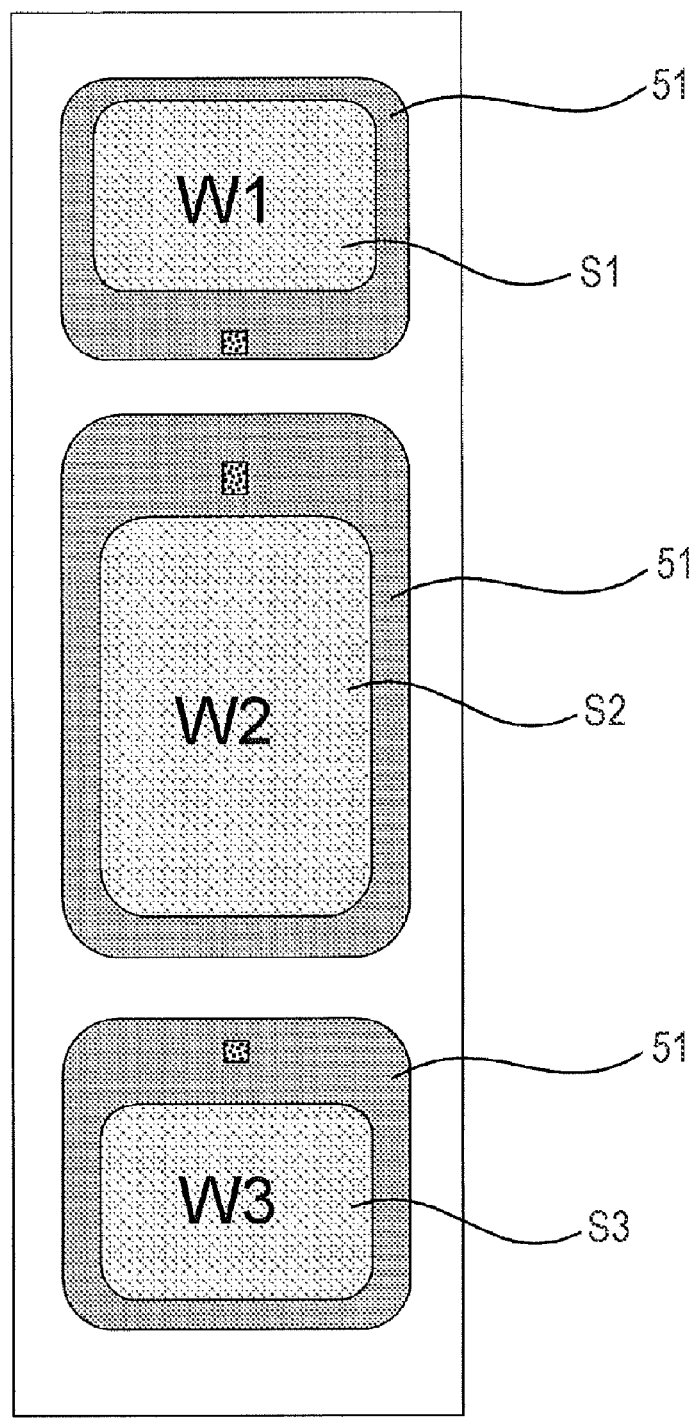
FIG. 6 is a plan view explaining apertures of the pixel portion in the embodiment.

FIG. 6 is a plan view explaining apertures of the pixel portion in the embodiment. The plan view shows a layout of anode electrodes 51 and apertures corresponding to the transistor structure of one main pixel shown in FIG. 5. The anode electrodes 51 are connected to source electrodes of respective drive transistors Tr-d1 to Tr-d3 shown in FIG. 5 through contacts. Since there are three drive transistors Tr-d1 to Tr-d3 in the example shown in FIG. 5, three anode electrodes 51 are provided so as to correspond to these transistors.

The first aperture S1, the second aperture S2 and the third aperture S3 are provided at regions inside the three anode electrodes 51. The aperture size of the first aperture S1, the second aperture S2 and the third aperture S3 is determined by the insulating film for defining apertures 46. Though the insulating film for defining apertures 46 is used as the component for determining the aperture size, a shielding film to be provided at an upper layer can be used as an aperture defining portion. Emitted light is irradiated from the respective apertures S1 to S3.

In the embodiment, when the aperture size of the first aperture S1, the aperture size of the second aperture S2 is W2 and the aperture size of the third aperture S2 is W3, W2 is larger than W1 and W3. That is, W1, W2 and W3 are formed to be equal in the comparative example explained above, however, the aperture size W2 provided at a position other than both edge portions is formed to be larger than the aperture sizes W1, W3 arranged at both edge portions in the embodiment.

[Circuit Configuration]

Figure 7:
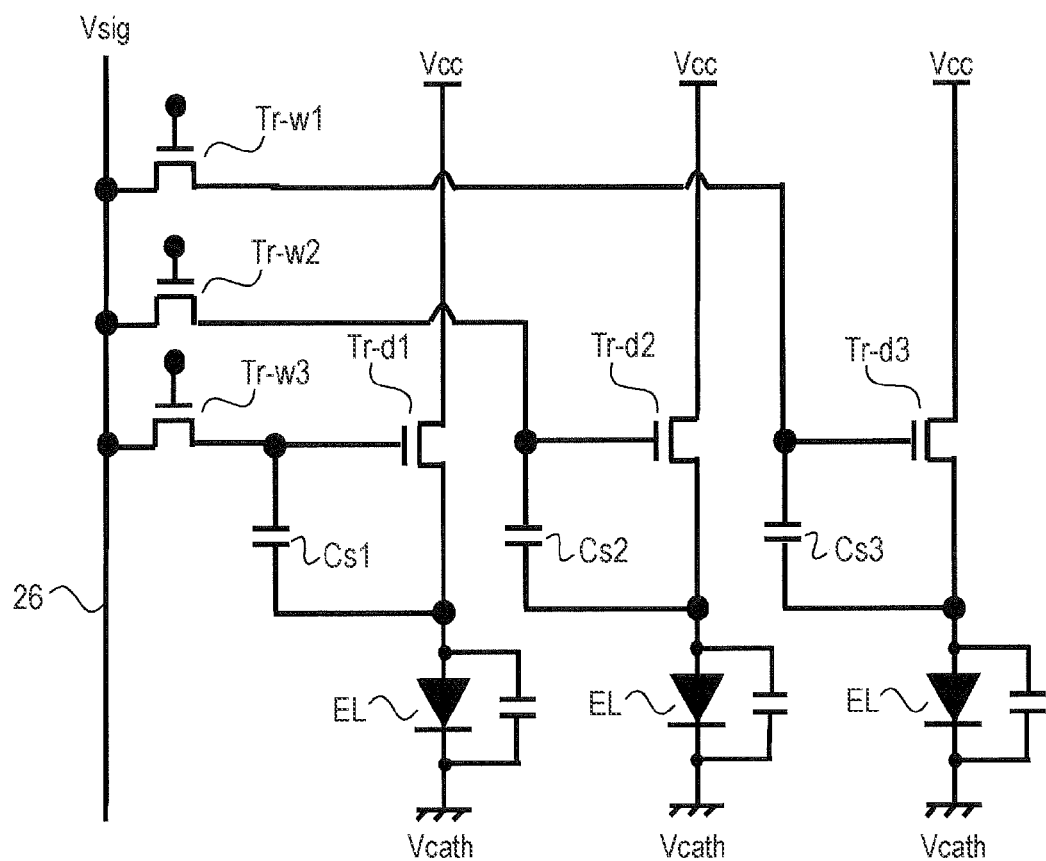
FIG. 7 is a circuit diagram explaining a circuit configuration of the pixel portion in the display device according to the embodiment.

FIG. 7 is a circuit diagram explaining a circuit configuration of the pixel portion in the display device according to the embodiment. In the embodiment, three apertures are provided at the main pixel and three write transistors Tr-w1 to Tr-w3 and three drive transistors Tr-d1 to Tr-d3 and three storage capacitors Cs1 to Cs 3 are provided so as to correspond to the respective apertures.

Gate electrodes of respective write transistors Tr-w1 to Tr-w3 are connected to a not-shown scanning line, drain electrodes of respective write transistors Tr-w1 to Tr-w3 are connected to the signal line 26.

Additionally, source electrodes of respective write transistors Tr-w1 to Tr-w3 are connected to gate electrodes of corresponding drive transistors Tr-d1 to Tr-d3 respectively. Drain electrodes of respective drive transistors Tr-d1 to Tr-d3 are connected to the power supply control line in common, to which power supply voltage is supplied. Source electrodes of respective drive transistors Tr-d1 to Tr-d3 are connected to anode electrodes of the organic EL light emitting layer. Cathode electrodes of the organic EL light emitting layer are grounded in common. The respective storage capacitors Cs1 to Cs3 are connected between gates and sources of corresponding drive transistors Tr-d1 to Tr-d3.

In the above circuit configuration, when a signal is inputted to the scanning line, three write transistors Tr-w1 to Tr-w3 are turned on, and the signal is stored in respective storage capacitors Cs1 to Cs3 from the signal line 26. The drive transistors Tr-d1 to Tr-d3 are operated in accordance with the signal, and voltage corresponding to the signal is applied to the anode electrodes of the organic EL light emitting layer. The organic EL light emitting layer emits light by the voltage.

3. Specific Example

Next, a specific example of apertures in the pixel portion will be explained. The explanation of the specific example will be made with a comparative example in order to make the embodiment easily understandable.

Comparative Example

Figure 8:
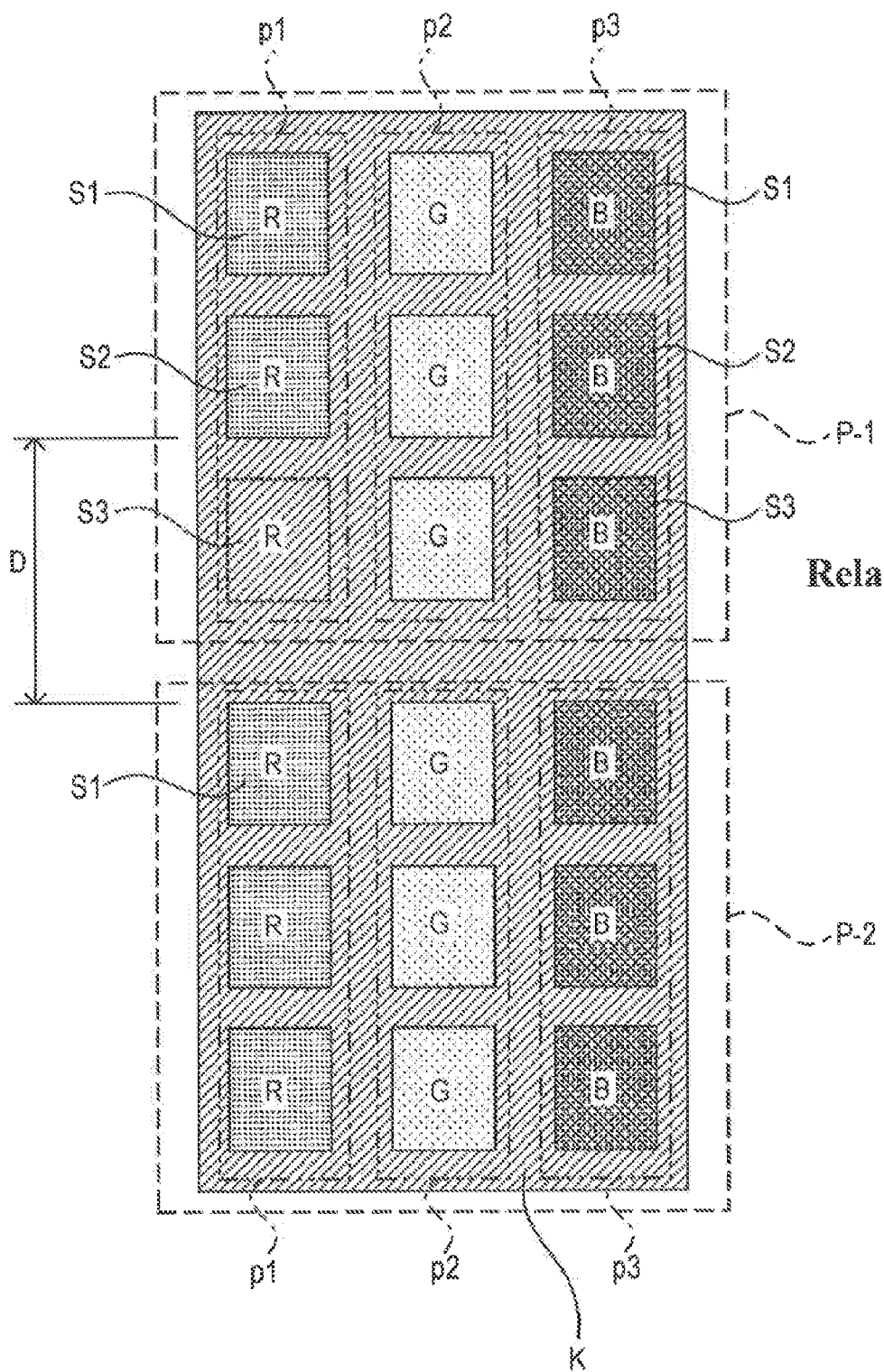
FIG. 8 is a plan view explaining a specific example of apertures in the comparative example.

FIG. 8 is a plan view explaining a specific example of apertures in the comparative example. In the drawing, apertures of two main pixels P-1, P-2 which are vertically adjacent are shown. Since the apertures of two main pixels P-1, P-2 are the same, a layout of the apertures will be explained by using the main pixel P-1 here.

In the main pixel P-1, three sub-pixels p1, p2 and p3 are provided. Each of sub-pixels p1, p2 and p3 emits light corresponding to one color respectively. For example, the sub-pixel p1 emits light corresponding to R (red), the sub-pixel p2 emits light corresponding to G (green) and the sub-pixel p3 emits light corresponding to B (blue).

Respective sub-pixels p1, p2 and p3 are laid out so that three apertures S1, S2 and S3 are aligned in one direction (vertical direction in the drawing) according to corresponding colors. The aperture sizes of respective apertures S1, S2 and S3 are defined by an aperture defining portion K (for example, an insulating film for defining apertures or a shielding film). In the comparative example, the apertures are provided so that the aperture sizes of respective apertures S1, S2 and S3 are equal.

The three apertures S1, S2 and S3 provided at respective sub-pixels p1, p2 and p3 emit light at the same time so as to correspond to respective colors. That is, when light of R (red) in the main pixel P-1 is emitted, light is emitted from three apertures S1 to S3 of the sub-pixel p1 corresponding to R (red) at the same time. Similarly, when light of G (green) in the main pixel P-1 is emitted, light is emitted from three apertures S1 to S3 of the sub-pixel p2 corresponding to G (green) at the same time. Also similarly, when light of B (blue) in the main pixel P-1 is emitted, light is emitted from three apertures S1 to S3 of the sub-pixel p3 corresponding to B (blue) at the same time.

Here, a case in which a light emission failure occurs at any one of three apertures S1, S2 and S3 in each of the sub-pixels p1, p2 and p3 will be explained. The light emission failure occurs due to a failure of a transistor corresponding to each of apertures S1, S2 and S3 or a failure between electrodes in the organic EL light emitting layer. In the following explanation, the light emission failure caused by the failure of the transistor corresponding to the aperture or the failure of the organic EL light emitting layer will be just expressed as a light emission failure at an aperture.

For example, assume that the aperture S3 arranged at the lower edge portion of the sub-pixel p1 corresponding to R (red) shown in FIG. 8 has a light emission failure. Since the aperture S3 does not emit light in this case, a distance between apertures which normally emit light will be a distance D between the aperture S2 adjacent to the aperture S3 having the light emission failure in the upward direction and the aperture S1 of the sub-pixel p1 in the main pixel P-2 adjacent in the downward direction. In this case, the case in which the light emission failure occurs at the aperture S3 of the sub-pixel p1 corresponding to R (red) is cited as an example, however, it is also the same in cases in which the failure occurs at apertures S3 of the sub-pixels p2, p3 corresponding to G (green) and B (blue).

Present Embodiment

Figure 9:
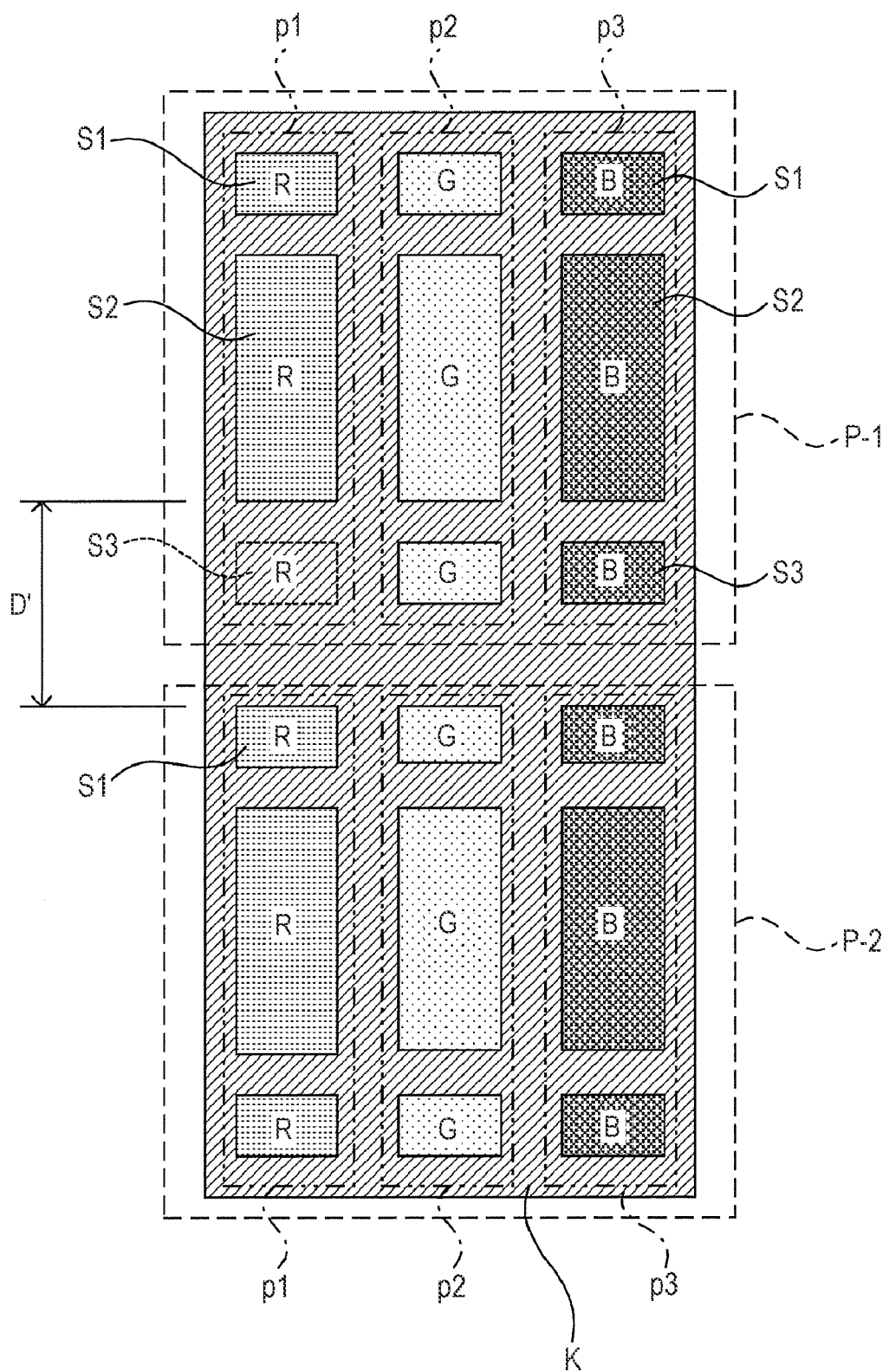
FIG. 9 is a plan view explaining a specific example of apertures in the embodiment.

FIG. 9 is a plan view explaining a specific example of apertures in the embodiment. In the drawing, apertures of two main pixels P-1, P-2 which are vertically adjacent are shown. Since the apertures of two main pixels P-1, P-2 are the same, a layout of the apertures will be explained by using the main pixel P-1 here.

In the main pixel P-1, three sub-pixels p1, p2 and p3 are provided. Each of sub-pixels p1, p2 and p3 emits light corresponding to one color respectively. For example, the sub-pixel p1 emits light corresponding to R (red), the sub-pixel p2 emits light corresponding to G (green) and the sub-pixel p3 emits light corresponding to B (blue).

Respective sub-pixels p1, p2 and p3 are laid out so that three apertures S1, S2 and S3 are aligned in one direction (vertical direction in the drawing) according to corresponding colors. The aperture sizes of respective apertures S1, S2 and S3 are defined by the aperture defining portion K (for example, an insulating film for defining apertures or a shielding film). In the embodiment, the apertures are provided so that the aperture size of the aperture S2 other than apertures at both edge portions is larger than the aperture size of the apertures S1, S3 at both edge portions in the three apertures S1, S2 and S3.

The three apertures S1, S2 and S3 provided at respective sub-pixels p1, p2 and p3 emit light at the same time so as to correspond to respective colors. That is, when light of R (red) in the main pixel P-1 is emitted, light is emitted from three apertures S1 to S3 of the sub-pixel p1 corresponding to R (red) at the same time. Similarly, when light of G (green) in the main pixel P-1 is emitted, light is emitted from three apertures S1 to S3 of the sub-pixel p2 corresponding to G (green) at the same time. Also similarly, when light of B (blue) in the main pixel P-1 is emitted, light is emitted from three apertures S1 to S3 of the sub-pixel p3 corresponding to B (blue) at the same time.

Here, a case in which a light emission failure occurs at any one of three apertures S1, S2 and S3 in each of the sub-pixels p1, p2 and p3 will be explained. The light emission failure occurs due to a failure of a transistor corresponding to each of apertures S1, S2 and S3, a failure between electrodes in the organic EL light emitting layer or the like.

For example, assume that the aperture S3 arranged at the lower edge portion of the sub-pixel p1 corresponding to R (red) shown in FIG. 9 has a light emission failure. Since the aperture S3 does not emit light in this case, a distance between apertures which normally emit light will be a distance D' between the aperture S2 adjacent to the aperture S3 having the light emission failure in the upward direction and the aperture S1 of the sub-pixel p1 in the main pixel P-2 adjacent in the downward direction. In this case, the case in which the light emission failure has occurred in the aperture S3 of the sub-pixel p1 corresponding to R (red) is cited as an example, however, it is also the same in cases in which the failure occurs at apertures S3 of the sub-pixels p2 and p3 corresponding to G (green) and B (blue).

When comparing the embodiment with the comparative example, in the case where the light emission failure occurs at the same aperture S3 of the sub-pixel p1 corresponding to R (red), the distance of apertures normally emit light is D in the comparative example, whereas it is D' in the embodiment. The distance D' in the embodiment is shorter than the distance D in the comparative example. This is because the aperture sizes of the apertures S1, S2 and S3 included in respective sub-pixels p1, p2 and p3 are not equal and the aperture size of the aperture S2 other than apertures at edge portions is larger than those of the apertures S1, S3 at edge portions. Accordingly, in the embodiment, a non-light emitting region in the case where the light emission failure occurs at the aperture S3, namely, the distance D' will be shorter than the distance D in the comparative example, as a result, it is hardly visible as a non-light emitting region.

Next, specific examples of apertures in the display device according to the embodiment will be explained.

Detailed Specific Example of the Embodiment

No. 1

Figure 10:
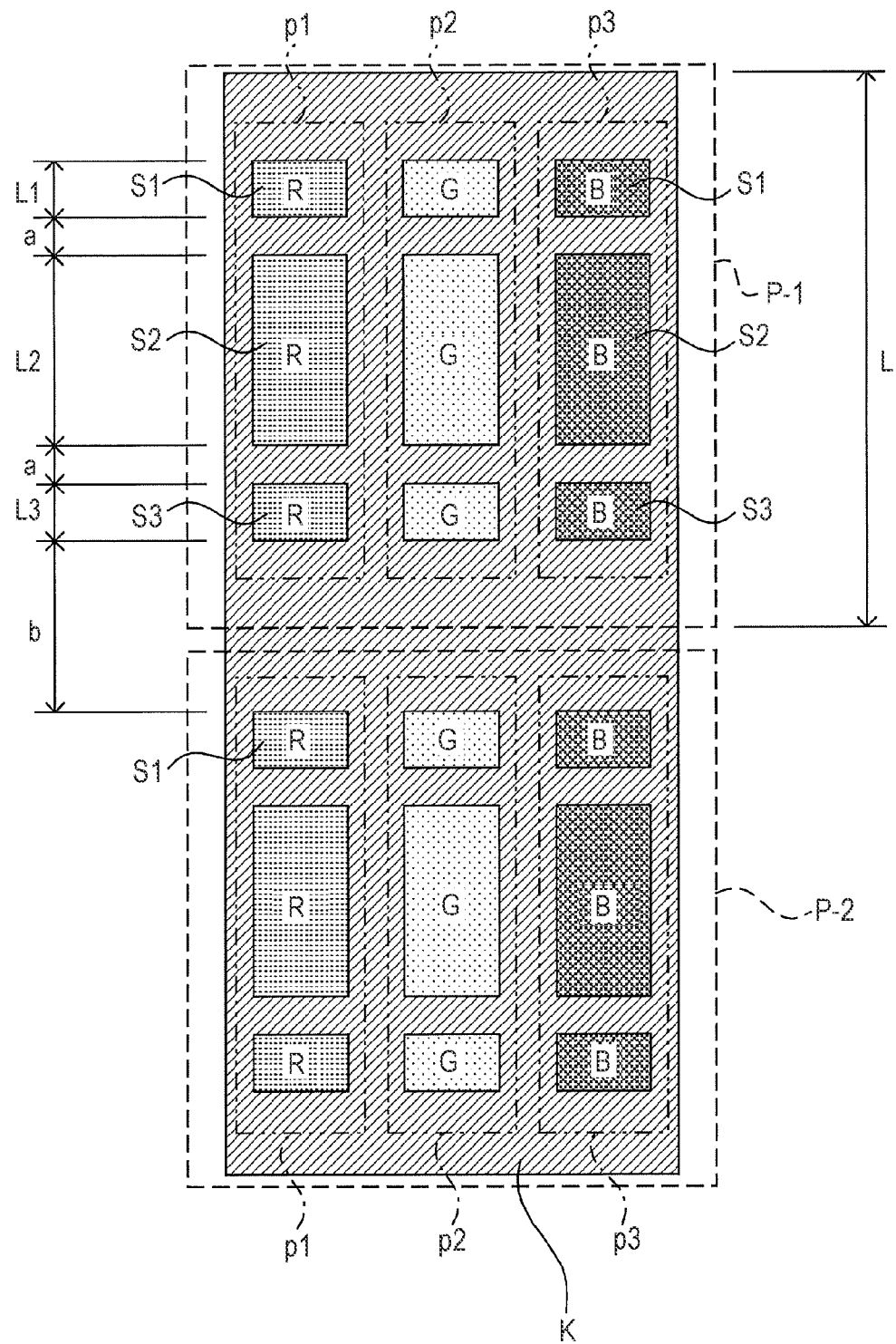
FIG. 10 is a plan view explaining a detailed specific example (No. 1) of apertures in the display device according to the embodiment.

FIG. 10 is a plan view explaining a detailed specific example (No. 1) of apertures in the display device according to the embodiment. In the drawing, apertures in two main pixels P-1, P-2 adjacent in the vertical direction are shown. Concerning the layout of apertures shown in FIG. 10, three apertures S1, S2 and S3 are aligned in one direction (vertical direction in the drawing) in each of sub-pixels p1, p2 and p3 respectively formed in the main pixels P-1, P-2 in the same manner as the layout of apertures shown in FIG. 9. The sizes of respective apertures S1, S2 and S3 are defined by the aperture defining portion K.

Since the same layout of apertures as the specific example shown in FIG. 9 is applied in the detailed specific example shown in FIG. 10, detailed explanation of the main pixels P-1, P-2, the sub-pixels p1, p2 and p3 and the apertures S1, S2 and S3 is omitted. Therefore, the size configuration about the respective apertures S1, S2 and S3 as well as distances therebetween will be explained below in detail. Also, the layout of apertures is the same in respective sub-pixel p1, p2 and p3, therefore, explanation will be made by using the sub-pixel p1.

As sizes used in explanation of the example shown in FIG. 10, lengths along the vertical direction in the drawing (direction of alignment of apertures S1 to S3) are used. As the lengths along this direction, an aperture length of the aperture S1 is denoted as L1, an aperture length of the aperture S2 is denoted as L2 and an aperture length of the aperture S3 is denoted as L3. A distance between the aperture S1 and the aperture S2 as well as a distance between the aperture S2 and the aperture S3 are denoted as "a". Additionally, a distance between the aperture S3 and the aperture S1 of the sub-pixel in the main pixel P-2 adjacent in the downward direction is denoted as "b". A length of the main pixel P-1 is denoted as L.

In the example shown in FIG. 10, the aperture size L1 of the aperture S1 arranged at the upper edge portion of the sub-pixel p1 is equal to the aperture size L3 of the aperture S3 arranged at the lower edge portion.

$$L1=L3$$

The aperture size L2 of the aperture S2 arranged at the center of the sub-pixel p1 is larger than the aperture sizes L1, L3 of the apertures S1, S3 at the edge portions.

$$L2>L1, L2>L3$$

The distance "a" between the aperture S1 and the aperture S2 and the distance "a" between the aperture S2 and the aperture S3 in the sub-pixel p1 are smaller than the distance "b" between the aperture S3 at the lower edge portion of the sub-pixel p1 in the main pixel P-1 and the aperture S1 at the upper edge portion of the sub-pixel p1 in the main pixel P-2 which is adjacent to the main pixel P-1 in the vertical direction.

$$a<b$$

Moreover, a sum of the aperture size L3 of the aperture S3, the distance "a" above L3 and the distance "b" below L3 is equal to a sum of the aperture size L2 of the aperture S2, the distance "a" above L2 and the distance "a" below L2.

$$L3+a+b=L2+2a$$

Furthermore, aperture lengths of the three apertures S1, S2 and S3 in the sub-pixel p1 along the horizontal direction in the drawing are equal. The length L of the main pixel P-1 is equal to L1+L2+L3+2a+b.

According to the above relationship, when the light emission failure occurs in any of the three apertures S1, S2 and S3, distances between adjacent apertures which normally emit light can be approximately equal in the embodiment.

For example, when the light emission failure occurs at the aperture S3 arranged at the lower edge portion of the sub-pixel p1, a length of a region in which light of color corresponding to the sub-pixel p1 (red) is reduced will be the length obtained by adding the aperture size L3 of the aperture S3 to the distances "a", "b" which are above and below the aperture S3. That is, when the light emission failure occurs at the aperture S3, the distance from the lower edge of the aperture S2 adjacent in the upward direction to the upper edge of the aperture S1 positioned at the upper edge portion of the sub-pixel p1 in the main pixel P-2 adjacent in the downward direction will be the region in which light emission failure occurs. The light emission failure region is expressed as L3+a+b.

When the light emission failure occurs at the aperture S2 arranged at the center of the sub-pixel p1, a length of a region in which light of color corresponding to the sub-pixel p1 (red) is reduced will be the length obtained by adding the aperture size L2 of the aperture S2 to respective distances "a" which are above and below the aperture S2. That is, when the light emission failure occurs at the aperture S2, the distance from the lower edge of the aperture S1 adjacent in the upward direction to the upper edge of the aperture S3 adjacent in the downward direction will be the region in which light emission failure occurs. The light emission failure region is expressed as L2+2a.

In the embodiment, the light emission failure region L3+a+b in the case where the aperture S3 has the light emission failure is equal to the light emission region L2+2a in the case in which the aperture S2 has the light emission failure.

According to this, when the light emission failure occurs at any of the three apertures S1, S2 and S3 provided in the sub-pixel p1, distances between apertures which normally emit light adjacent above and below the aperture having the failure can be equal. That is, when the light emission failure occurs at any aperture, the light emission failure regions will be equal, therefore, the difference in visibility as a non-light emitting region is not generated according to the position of the aperture.

The example of L3+a+b=L2+2a has been explained as the above, however, L3+a+b≦L2+2a is also preferable. This relational expression includes L3+a+b<L2+2a, however, in that case, even when the light emission failure occurs at the aperture S2 arranged at the center of the sub-pixel p1, the difference in visibility as the non-light emitting region can be interpolated by increasing light emitting luminance of the apertures S1, S3 which normally emit light.

Detailed Specific Example of the Embodiment

No. 2

Figure 11:
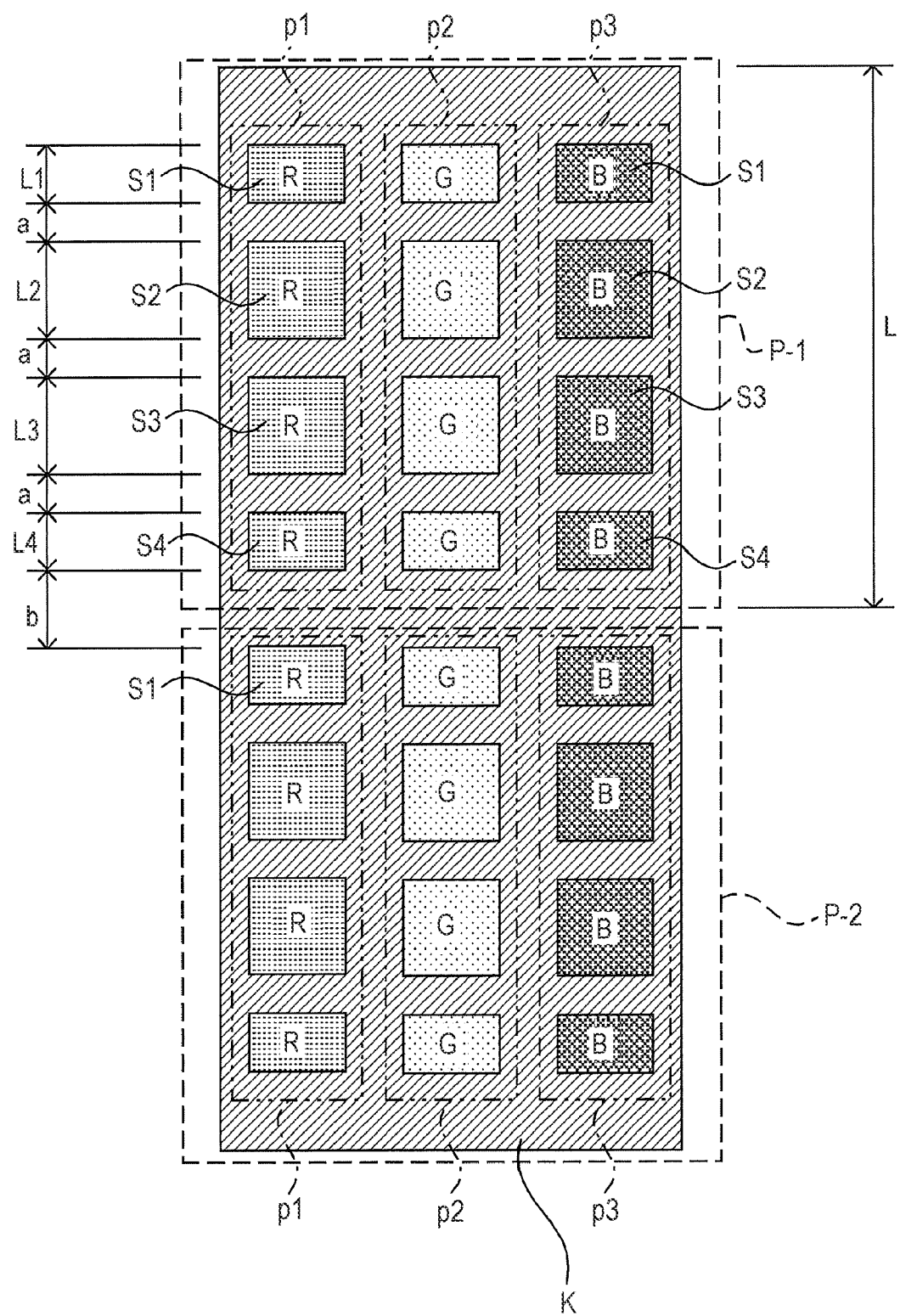
FIG. 11 is a plan view explaining a detailed specific example (No. 2) of apertures in the display device according to the embodiment.

FIG. 11 is a plan view explaining a detailed specific example (No. 2) of apertures in the display device according to the embodiment. In the drawing, apertures in two main pixels P-1, P-2 adjacent in the vertical direction are shown. Concerning the layout of apertures shown in FIG. 11, four apertures S1, S2, S3 and S4 are aligned in one direction (vertical direction in the drawing) in each of sub-pixels p1, p2 and p3 respectively formed in the main pixels P-1, P-2. The sizes of respective apertures S1 to S4 are defined by the aperture defining portion K.

In the following description, the size configuration about the respective apertures S1, S2, S3 and S4 as well as distances therebetween will be explained in detail. Also, the layout of apertures is the same in respective sub-pixel p1, p2 and p3, therefore, explanation will be made by using the sub-pixel p1.

As sizes used in explanation of the example shown in FIG. 11, lengths along the vertical direction in the drawing (direction of alignment of apertures S1 to S4) are used. As the lengths along this direction, an aperture length of the aperture S1 is denoted as L1, an aperture length of the aperture S2 is denoted as L2, an aperture length of the aperture S3 is denoted as L3 and an aperture length of the aperture S4 is denoted as L4. A distance between the aperture S1 and the aperture S2, a distance between the aperture S2 and the aperture S3 and a distance between the aperture S3 and the aperture S4 are denoted as "a". Additionally, a distance between the aperture S4 and the aperture S1 of the sub-pixel in the main pixel P-2 adjacent in the downward direction is denoted as "b". A length of the main pixel P-1 is denoted as L.

In the example shown in FIG. 11, the aperture size L1 of the aperture S1 arranged at the upper edge portion of the sub-pixel p1 is equal to the aperture size L4 of the aperture S4 arranged at the lower edge portion.

$$L1=L4$$

The aperture size L2 of the aperture S2 and the aperture size L3 of the aperture S3 arranged at positions other than both edge portions in the sub pixel p1 are equal.

$$L2=L3$$

The aperture sizes L2, L3 of the apertures S2, S3 arranged at positions other than both edge portions of the sub pixel p1 are larger than the aperture sizes L1, L4 of the apertures S1, S4 at edge portions.

$$L2=L3>L1=L4$$

The distance "a" between respective apertures S1 to S4 in the sub-pixel p1 are smaller than the distance "b" between the aperture S4 at the lower edge portion of the sub-pixel p1 in the main pixel P-1 and the aperture S1 at the upper edge portion of the sub-pixel p1 in the main pixel P-2 which is adjacent to the main pixel P-1 in the vertical direction.

$$a<b$$

Moreover, a sum of the aperture size L4 of the aperture S4, the distance "a" above L4 and the distance "b" below L4 is equal to a sum of the aperture size L2 or the aperture size L3 of the aperture S2 or the aperture S3, the distance "a" above L2 or L3 and the distance "a" below L2 or L3.

$$L4+a+b=L2+2a$$

$$L4+a+b=L3+2a$$

Furthermore, aperture lengths of the four apertures S1, S2, S3 and S4 in the sub-pixel p1 along the horizontal direction in the drawing are equal. The length L of the main pixel P-1 is equal to L1+L2+L3+L4+3a+b.

According to the above relationship, when the light emission failure occurs in any of the four apertures S1, S2, S3 and S4, distances between adjacent apertures which normally emit light can be approximately equal in the embodiment.

For example, when the light emission failure occurs at the aperture S4 arranged at the lower edge portion of the sub-pixel p1, a length of a region in which light of color corresponding to the sub-pixel p1 (red) is reduced will be the length obtained by adding the aperture size L4 of the aperture S4 to the distances "a", "b" which are above and below the aperture S4. That is, when the light emission failure occurs at the aperture S4, the distance from the lower edge of the aperture S3 adjacent in the upward direction to the upper edge of the aperture S1 positioned at the upper edge portion of the sub-pixel p1 in the main pixel P-2 adjacent in the downward direction will be the region in which light emission failure occurs. The light emission failure region is expressed as L4+a+b.

When the light emission failure occurs at the aperture S2 or the aperture S3 arranged at the center of the sub-pixel p1, a length of a region in which light of color corresponding to the sub-pixel p1 (red) is reduced will be the length obtained by adding the aperture size L2 of the aperture S2 or the aperture size L3 of the aperture S3 to respective distances "a" which are above and below the aperture S2 or the aperture S3. That is, when the light emission failure occurs at the aperture S2, the distance from the lower edge of the aperture S1 adjacent in the upward direction to the upper edge of the aperture S3 adjacent in the downward direction will be the region in which light emission failure occurs. The light emission failure region is expressed as L2+2a. Also, when the light emission failure occurs at the aperture S3, the distance from the lower edge of the aperture S2 adjacent in the upward direction to the upper edge of the aperture S4 adjacent in the downward direction will be the region in which light emission failure occurs. The light emission failure region is expressed as L3+2a.

In the embodiment, the light emission failure region L4+a+b in the case where the aperture S4 has the light emission failure is equal to the light emission failure region L2+2a or L3+2a in the case where the aperture S2 or the aperture S3 has the light emission failure.

In the case where four apertures S1 to S4 are provided at the sub-pixel p1 as described above, the same effects as the case of three apertures can be obtained. That is, when the light emission failure occurs at any of the four apertures S1, S2, S3 and S4, distances between adjacent apertures which normally emit light can be approximately equal. Therefore, when the light emission failure occurs at any aperture, the light emission failure regions will be equal, therefore, the difference in visibility as a non-light emitting region is not generated according to the position of the aperture.

The examples of L4+a+b=L2+2a, L4+a+b=L3+2a have been explained as the above, however, L4+a+b≦L2+2a, L4+a+b≦L3+2a are also preferable. This relational expressions include L4+a+b<L2+2a, L4+a+b<L3+2a, in the same manner as the above, even when the light emission failure occurs at the aperture S2 or S3 arranged at the center of the sub-pixel p1, the difference in visibility of the non-light emitting region can be interpolated by increasing light emitting luminance of the apertures which normally emit light.

In addition to the case of three apertures and the case of four apertures as described above, the same concept can be applied also to cases of five or more apertures, whereby the same effects can be obtained.

4. Application Example

The display device according to the embodiment described above can be applied to various electronic apparatuses by being provided in main casings thereof. As examples, the display device can be applied to various electronic apparatuses shown in FIG. 12 to FIG. 16G. For example, the invention can be applied to display devices of electronic apparatuses in various fields in which a video signal inputted to the electronic apparatus or a video signal generated in the electronic apparatus is displayed as images or video, such as a digital camera, a notebook personal computer, portable terminal devices such as a cellular phone and a video camera.

As described above, the display device according to the embodiment is used as display devices for electronic apparatuses in various fields, thereby improving image quality of display images, therefore, there is an advantage that good quality images can be displayed in various electronic apparatuses.

The display device according to the embodiment also includes a module-shaped device having a sealed structure. For example, a display module formed by a pixel array portion 102 being bonded to an opposite portion such as a transparent glass is appropriate. It is also preferable that color filters, a protection film, a shielding film and so on are provided on the transparent opposite portion. The display module may be provided with a circuit portion or a FPC (flexible print circuit) for inputting and outputting a signal and the like from the outside to the pixel array portion.

Specific examples of electronic apparatuses to which the display device according to the embodiment is applied will be explained below.

Figure 12:
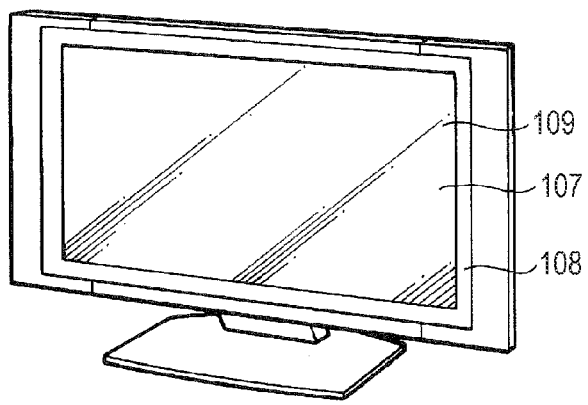
FIG. 12 is a perspective view showing a television set to which the embodiment is applied.

FIG. 12 is a perspective view showing an appearance of a television set to which the embodiment is applied. The television set according to the application example includes a video display screen portion 107 having a front panel 108, a filter glass 109 and the like, which is manufactured by using the display device according to the embodiment as the video display screen portion 107.

Figure 13A:
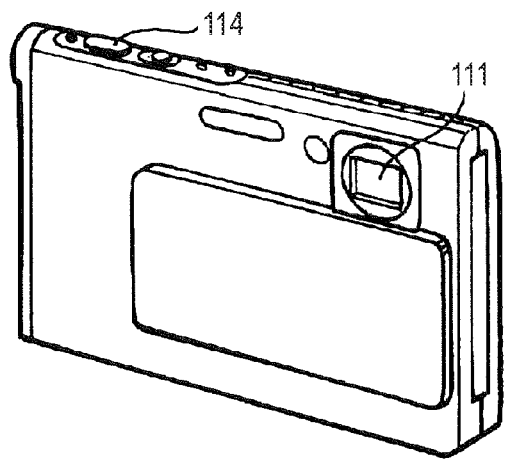
FIG. 13A and FIG. 13B are perspective views showing a digital camera to which the embodiment is applied.
Figure 13B:
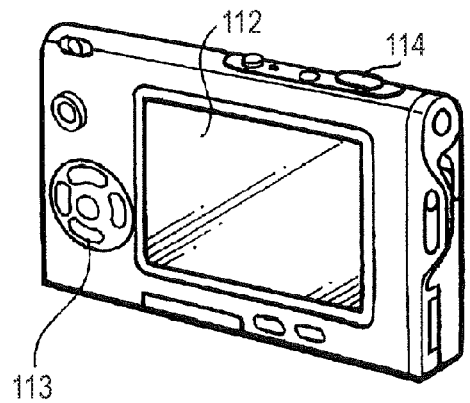

FIG. 13A and FIG. 13B are perspective views showing an appearance of a digital camera to which the embodiment is applied. FIG. 13A is a perspective view seen from the front and FIG. 13B is a perspective view seen from the back. The digital camera according to the embodiment includes a light emitting portion 111 for flash, a display portion 112, a menu switch 113, a shutter button 114 and so on, which is manufactured by using the display device according to the embodiment as the display portion 112.

Figure 14:
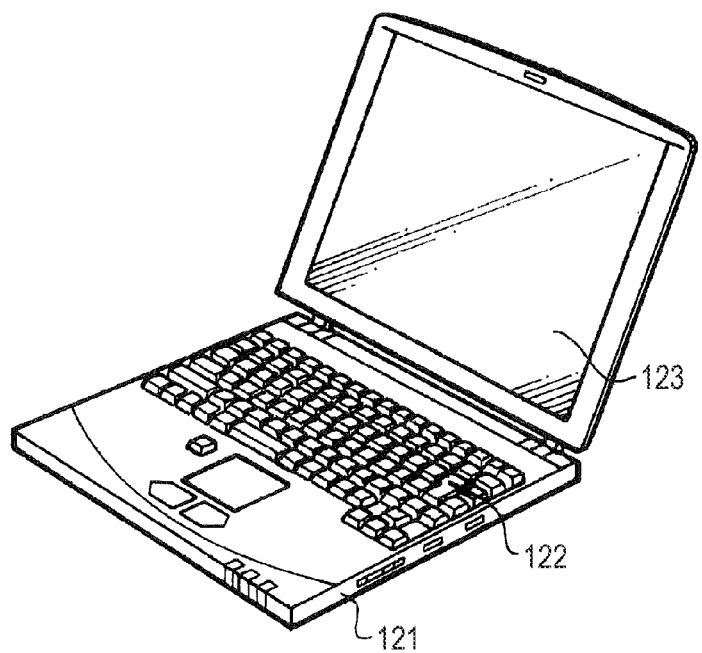
FIG. 14 is a perspective view showing a notebook personal computer to which the embodiment is applied.

FIG. 14 is a perspective view showing an appearance of a notebook personal computer to which the embodiment is applied. The notebook personal computer according to the application example includes a body 121, a keyboard 122 operated when inputting characters and the like and a display portion 123 displaying images and so on, which is manufactured by using the display device according to the embodiment as the display portion 123.

Figure 15:
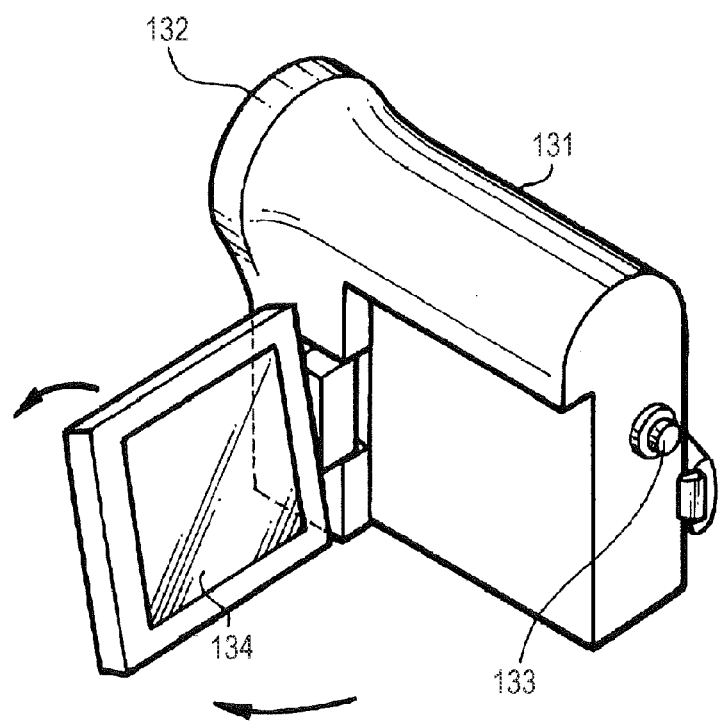
FIG. 15 is a perspective view showing an appearance of a video camera to which the embodiment is applied.

FIG. 15 is a perspective view showing an appearance of a video camera to which the embodiment is applied. The video camera according to the application example includes a body 131, a lens 132 for imaging objects at a side surface facing the front and a start/stop switch 133 used at the time of imaging and a display portion 134 and the like, which is manufactured by using the display device according to the embodiment as the display portion 134.

FIG. 16A to FIG. 16G are exterior views showing a portable terminal device, for example, a cellular phone device to which the embodiment is applied. FIG. 16A is a front view in an opened state, FIG. 16B is a side view thereof, FIG. 16C is a front view in an closed state, FIG. 16D is a left-side view, FIG. 16E is a right-side view, FIG. 16F is an upper surface view and FIG. 16G is a lower surface view. The cellular phone device according to the embodiment includes an upper casing 141, a lower casing 142, a connecting portion (a hinge portion in this case) 143, a display 144, a sub-display 145, a picture light 146, a camera 147 and so on, which is manufactured by using the display device according to the embodiment as the display 144 or the sub-display 145.

The present application contains subject matter related to that disclosed in Japanese Priority Patent Application JP 2009-096609 filed in the Japan Patent Office on Apr. 13, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   a plurality of sub-pixels included in a main pixel, the plurality of sub-pixels configured to emit light of different colors respectively, each of the plurality of sub-pixels having at least three apertures aligned along one direction; and
   an aperture defining portion defining aperture lengths of each of the at least three apertures so that an aperture length of an aperture other than apertures at opposite ends of the main pixel along the one direction is longer than an aperture length of the apertures at opposite ends of the main pixel along the one direction,
   wherein,
   when (i) a distance between the aperture other than the apertures at opposite ends of the main pixel and an adjacent aperture is "a", (ii) a distance between one of the apertures at opposite ends of the main pixel and another aperture at an end of another main pixel adjacent to the main pixel in the one direction is "b", (iii) an aperture length of one of the apertures at opposite ends of the main pixel along the one direction is "Le", and (iv) an aperture length of an aperture other than the apertures at opposite ends of the main pixel along the one direction is "Ls",
   $a < b$, and
   $Le + a + b = Ls + 2a$ are satisfied.

2. The display device according to claim 1,
   wherein aperture lengths of at least three apertures in the plurality of sub-pixels along a direction orthogonal to the one direction are equal.

3. An electronic apparatus comprising:
   a display device in a main casing,
   wherein the display device includes,
   a plurality of sub-pixels included in a main pixel, the plurality of sub-pixels configured to emit light of different colors respectively, each of the plurality of sub-pixels having at least three apertures arranged so as to be aligned along one direction; and
   an aperture defining portion defining aperture lengths of each of the at least three apertures so that an aperture length of an aperture other than apertures at opposite ends of the main pixel along the one direction is longer than an aperture length of the apertures at opposite ends of the main pixel along the one direction,
   wherein
   when (i) a distance between the aperture other than the apertures at opposite ends of the main pixel and an adjacent aperture is "a", (ii) a distance between one of the apertures at opposite ends of the main pixel and another aperture at an end of another main pixel adjacent to the main pixel in the one direction is "b", (iii) an aperture length of one of the apertures at opposite ends of the main pixel along the one direction is "Le", and (iv) an aperture length of an aperture other than the apertures at opposite ends of the main pixel along the one direction is "Ls",
   $a < b$, and
   $Le + a + b = Ls + 2a$ are satisfied.

4. The electronic apparatus according to claim 3,
   wherein aperture lengths of at least three apertures in the plurality of sub-pixels along a direction orthogonal to the one direction are equal.

* * * * *